United States Patent
Fukumoto et al.

(10) Patent No.: US 6,879,026 B2
(45) Date of Patent: Apr. 12, 2005

(54) SURFACE PROTECTING ADHESIVE FILM FOR SEMICONDUCTOR WAFER AND PROCESSING METHOD FOR SEMICONDUCTOR WAFER USING SAID ADHESIVE FILM

(75) Inventors: Hideki Fukumoto, Nagoya (JP);
Takanobu Koshimizu, Nagoya (JP);
Makoto Kataoka, Nagoya (JP);
Yoshihisa Saimoto, Nagoya (JP)

(73) Assignee: Mitsui Chemicals, Inc., Tokyo (JP)

( * ) Notice: Subject to any disclaimer, the term of this patent is extended or adjusted under 35 U.S.C. 154(b) by 103 days.

(21) Appl. No.: 10/339,344

(22) Filed: Jan. 10, 2003

(65) Prior Publication Data

US 2003/0219960 A1 Nov. 27, 2003

(30) Foreign Application Priority Data

Jan. 11, 2002 (JP) .................................. 2002-004056
Apr. 25, 2002 (JP) .................................. 2002-124021

(51) Int. Cl.$^7$ .............................................. H01L 23/58
(52) U.S. Cl. ........................ 257/642; 257/678; 438/118
(58) Field of Search ................................ 438/107, 118, 438/457, 459; 257/618, 619, 642, 678, 683

(56) References Cited

FOREIGN PATENT DOCUMENTS

| JP | 2000-150432 | 5/2000 |
| JP | 2000-212524 | 8/2000 |

*Primary Examiner*—Hsien-Ming Lee
(74) *Attorney, Agent, or Firm*—Burns, Doane, Swecker & Mathis, LLP

(57) ABSTRACT

An adhesive film for protecting the surface of a semiconductor wafer wherein the adhesive layer is formed on one surface of a substrate film, the substrate film comprising at least one layer which satisfies the following requisites (A) and at least one of (B) or (C):

requisite (A): high elastic modulus properties in which the storage modulus is $1 \times 10^9$ Pa to $1 \times 10^{10}$ Pa under the total temperature range of from 18 to 50° C.

requisite (B): high elastic modulus properties in which the storage modulus within at least part of the temperature range of from 50 to 90° C. is not more than $1 \times 10^8$ Pa.

requisite (C): high elastic modulus properties with expansibility by water absorption in which the size-changing ratio by absorbing water for four hours is 0.05 to 0.5% at 23° C. and 90% RH.

12 Claims, 1 Drawing Sheet

SURFACE PROTECTING ADHESIVE FILM FOR SEMICONDUCTOR WAFER AND PROCESSING METHOD FOR SEMICONDUCTOR WAFER USING SAID ADHESIVE FILM

FIELD OF THE INVENTION

This invention relates to an adhesive film for protecting the surface of a semiconductor wafer and method of processing the non-circuit-formed surface of a semiconductor wafer using said adhesive film for protecting the surface of a semiconductor wafer. More specifically, it relates to an adhesive film for protecting the surface of a semiconductor wafer which is used by adhering to the surface of a semiconductor wafer made of silicon and gallium arsenide (GaAs) and so on wherein an circuit is formed in processing the other surface of said wafer, and method of processing the non-circuit-formed surface of the semiconductor wafer using the same.

More specifically, it relates to an adhesive film for protecting the surface of a semiconductor wafer which is preferable for damage protection and improvement of productivity of the semiconductor wafer in the manufacturing process of a thin-layered semiconductor chip, especially in the non-circuit-formed surface processing, peeling processing of the adhesive film, conveying processing and so on, and method of processing the non-circuit-formed surface of the semiconductor wafer using the same.

BACKGROUND OF THE INVENTION

These days it is expected to further reduce the thickness of a semiconductor chip in connection with diffusion of IC cards, mobile communication equipment and so on, or the miniaturization and reduction of thickness of electronic instruments. The thickness of a semiconductor chip has been around 300 μm heretofore, but it has been required to reduce thickness to 150 μm or less in some cases.

A semiconductor chip is generally manufactured through steps of: adhering an adhesive film for protecting the surface of a semiconductor wafer on the surface of a semiconductor wafer where circuits are formed; reducing the thickness of the semiconductor wafer by processing the non-circuit-formed surface thereof; peeling the adhesive film for protecting the surface of a semiconductor wafer; and finally dicing the semiconductor wafer for finishing. Especially as for the non-circuit-formed surface processing in manufacturing a semiconductor chip with the thickness less than 150 μm, the first step is reducing the thickness to about 200 to 150 μm by the conventional grinding process, then sometimes further reducing the thickness by polishing, chemical etching and so on. Lately has been developed a technique to reduce the thickness of a semiconductor wafer to as thin as only 25 μm by a back grinding process and without polishing or chemical etching.

However, such a thin-layered semiconductor wafer may have a significant degree of warpage deformation because of its deteriorating rigidity, which becomes a manufacturing problem. In a process of reducing the thickness of a semiconductor chip in general, a semiconductor wafer is taken out of a wafer cassette by a robot and fixed to a jig which is called a "chuck table" in the processing machine to conduct the non-circuit-formed surface processing. The wafer is, after the non-circuit-formed surface processing, carried back into the wafer cassette or carried away to the next manufacturing process. If the warpage deformation of the wafer is significant during these processes, some of the processing may come to a halt because the wafer is damaged or because the robot can not convey the wafer, and so on. Also in the peeling process of the adhesive film for protecting the surface of a semiconductor wafer, serious problem such as the damage of wafers may occur because of flattening the wafer by force in fixing it to the "chuck table" in the peeling machine.

A thinning-processed semiconductor wafer may cause a warpage deformation. It is said to occur by the residual stresses of adhesive film for protecting the surface of a semiconductor wafer which is adhered on the wafer surface and of the protection film for circuits which is mounted on the wafer surface. The residual stress of adhesive film for protecting the surface of a semiconductor wafer occurs by tensile force which is applied to said adhesive film when it is adhered to the surface of semiconductor wafers. Generally speaking, adhesive film for protecting the surface of a semiconductor wafer using a stretchy, flexible substrate film tends to cause a big residual stress, resulting in an easy occurrence of warpage in semiconductor wafers.

On the other hand, the residual stress applied to circuit protection films is remarkable in the case of polyimide group protection films. Especially, if the polyimide group protection film is thick in the process of reducing the thickness of a semiconductor wafer, the warpage of the wafer increases by the residual stress of said polyimide group protection film, which may result in serious problems such as the halt of manufacturing processes caused by the damage of wafers or by incapability of conveyance by robots and so on.

As a method to decrease such warpage of thinning-processed wafers, various approaches have been examined by decreasing the residual stress applied when adhering the adhesive film for protecting the surface of a semiconductor wafer to the surface of semiconductor wafers. For example, in Japanese Laid-open Patent Publication No.2000-150432 is disclosed an adhesive film for protecting the surface of a semiconductor wafer using substrate film with high percentage of stress relaxation, and in No.2000-212524 is disclosed an adhesive film for protecting the surface of a semiconductor wafer using substrate film with high elastic modulus, respectively.

Though the adhesive film for protecting the surface of a semiconductor wafer using the substrate film with high percentage of stress relaxation disclosed in Japanese Laid-open patent Publication No.2000-150432 is effective to decrease the residual stress applied in adhering it to the surface of semiconductor wafers, it can not avoid any warpage of the semiconductor wafers which is caused by residual stress of circuit protection films. The adhesive film for protecting the surface of a semiconductor wafer using substrate film with high linear elastic modulus disclosed in Japanese Laid-open Patent Publication No.2000-212524, on the other hand, is effective to straighten the warpage of semiconductor wafers, but it is difficult to peel from the surface thereof.

DISCLOSURE OF THE INVENTION

The object of the present invention is, in view of the above problems, to provide an adhesive film for protecting the surface of a semiconductor wafer which makes it possible to straighten or avoid warpage of semiconductor wafers caused by the residual stress of circuit protection films thereof as well as to be easily peeled therefrom without damaging wafers even if the thickness of wafers is reduced down to 150 μm or less in the grinding process of the non-circuitformed surface of semiconductor wafers, and a method of processing the non-circuit-formed surface of semiconductor wafers using the same.

The inventors of the present invention, as a result of various examinations for decreasing warpage of semiconductor wafers, have achieved the present invention by focusing attention on such properties as (A) maintaining high rigidity within the range from around room temperature to 50° C., (B) deteriorating the rigidity at a temperature of 50° C. or above, and (C) size-changing ratio after absorbing water for four hours at a temperature of 23° C. with relative humidity (RH) 90% is 0.05% to 0.5%, and by finding out that the above problems can be solved by using a substrate film which has the (A) and (B) properties(two properties), (A) and (C) properties(also two properties) or (A) and (B) and (C) properties (three properties) to obtain the invented adhesive film.

That means, this invention relates to an adhesive film for protecting the surface of a semiconductor wafer wherein an adhesive layer is formed on one surface of the substrate film, characterized in that said substrate film satisfies the following requisites (A) and at least one of (B) or (C):

Requisite (A): high rigidity properties wherein the bending resistance value of the film is within the range of 0.08 to 1.50 N at a temperature of 50° C.

Requisite (B): properties wherein the bending resistance value of the film at a temperature of 90° C. is one third or less of that at a temperature of 50° C.

Requisite (C): high elastic modulus properties with expansibility by water absorption wherein the size-changing ratio after absorbing water for four hours at a temperature of 23° C. with relative humidity(RH) 90% is 0.05% to 0.5%.

Further, this invention relates to an adhesive film for protecting the surface of a semiconductor wafer wherein an adhesive layer is formed on one surface of the substrate film, characterized in that said substrate film comprises at least one layer which satisfies the following requisites (A') and at least one of (B') or (C):

Requisite (A'): high elastic modulus properties wherein the storage modulus is $1 \times 10^9$ Pa to $1 \times 10^{10}$ Pa within the total temperature range of from 18 to 50° C.

Requisite (B'): high elastic modulus properties wherein the storage modulus is not more than $1 \times 10^8$ Pa within at least part of the temperature range of from 50 to 90° C.

Requisite (C): high elastic modulus properties with expansibility by water absorption C wherein the size-changing ratio after absorbing water for four hours at a temperature of 23° C. with RH(relative humidity)90% is 0.05 to 0.5%.

The adhesive film for protecting the surface of a semiconductor wafer concerning the present invention is characterized in that a substrate film thereof satisfies said requisites (A) and (B), (A) and (C), or (A) and (B) and (C) The adhesive film for protecting the surface of a semiconductor wafer provided concerning another aspect included in the present invention is characterized in that a substrate film comprises at least one layer which satisfies said requisites (A') and at least one of (B') or (C).

One of the preferred embodiments for the adhesive film for protecting the surface of a semiconductor wafer is to include a layer satisfying the requisites (A'), and at least one of (B') or (C) in which the proportion of maximum storage modulus value(E'max) against minimum storage modulus value(E'min), that is, "E'max/E'min" within the temperature range from 18 to 50° C. is 1.0 to 1.1.

Another preferred embodiment is provided in said adhesive film for protecting the surface of a semiconductor wafer wherein said adhesive film for protecting the surface of a semiconductor wafer and the substrate film comprises at least one resin layer with a low elastic modulus. The "low elastic modulus" in the present invention means that the resin has a storage modulus of lower than $1 \times 10^9$ Pa within the total temperature range of from 18 to 50° C.

Another aspect provided in the present invention is a method of processing the non-circuit-formed surface of a semiconductor wafer using said adhesive film for protecting the surface of a semiconductor wafer, which comprises the steps of: adhering the adhesive film for protecting the surface of a semiconductor wafer through the adhesive layer to the circuit-formed surface thereof; processing the non-circuit-formed surface of the semiconductor wafer until its thickness is reduced to 150 μm or less; then peeling the adhesive film for protecting the surface of a semiconductor wafer by heating to a temperature within the range of from 50 to 90° C.

In the back grinding process for a semiconductor wafer, it is possible by using the adhesive film for protecting the surface of a semiconductor wafer concerning the present invention to restrain the substrate film from elongation when adhering said adhesive film for protecting the surface of a semiconductor wafer to the circuit-formed surface thereof in order to straighten or avoid the wafer's warpage caused by residual stress of the circuit protection film for a semiconductor wafer, even if a wafer of which circuits are protected by a protection film is reduced in its thickness to 150 μm or less. Meanwhile, the substrate film of said adhesive film for protecting the surface of a semiconductor wafer expands moderately by coolant poured in the grinding process for the non-circuit-formed surface of a semiconductor wafer, washing water for the adhesive surface of the film and so on, making it possible to straighten or avoid warpage of semiconductor wafers so that the damage of wafers can be prevented. Also, the adhesive film for protecting the surface of a semiconductor wafer concerning the present invention can be easily peeled off from the circuit-formed surface of a semiconductor wafer without damaging wafers by heating because the elastic modulus of the substrate film decreases by heating.

One effect of the present invention is, by using the adhesive film for protecting the surface of a semiconductor wafer concerning the present invention, the elongation of the substrate film can be prevented which may occur in adhering the adhesive film for protecting the surface of a semiconductor wafer on the circuit-formed surface of a semiconductor wafer, to straighten or prevent the warpage of wafers caused by the residual stress of a circuit protection film for semiconductor wafers even if the thickness of a wafer of which circuits are protected by a protection film is reduced down to 150 μm or less in the back grinding process for a semiconductor wafer. Another effect is that the damage of wafers can be prevented by straightening and preventing the warpage of semiconductor wafers because the substrate film of the adhesive film for protecting the surface of a semiconductor wafer is appropriately expanded by cooling water which is poured in grinding the circuit-formed surface of a semiconductor wafer or washing water for the surface of the adhesive film, etc. A further effect is that the adhesive film for protecting the surface of a semiconductor wafer concerning the present invention can be easily peeled off from the circuit-formed surface of a semiconductor wafer without damaging the wafer by heating it in peeling, because the elastic modulus of the substrate film decreases.

Figure 1:
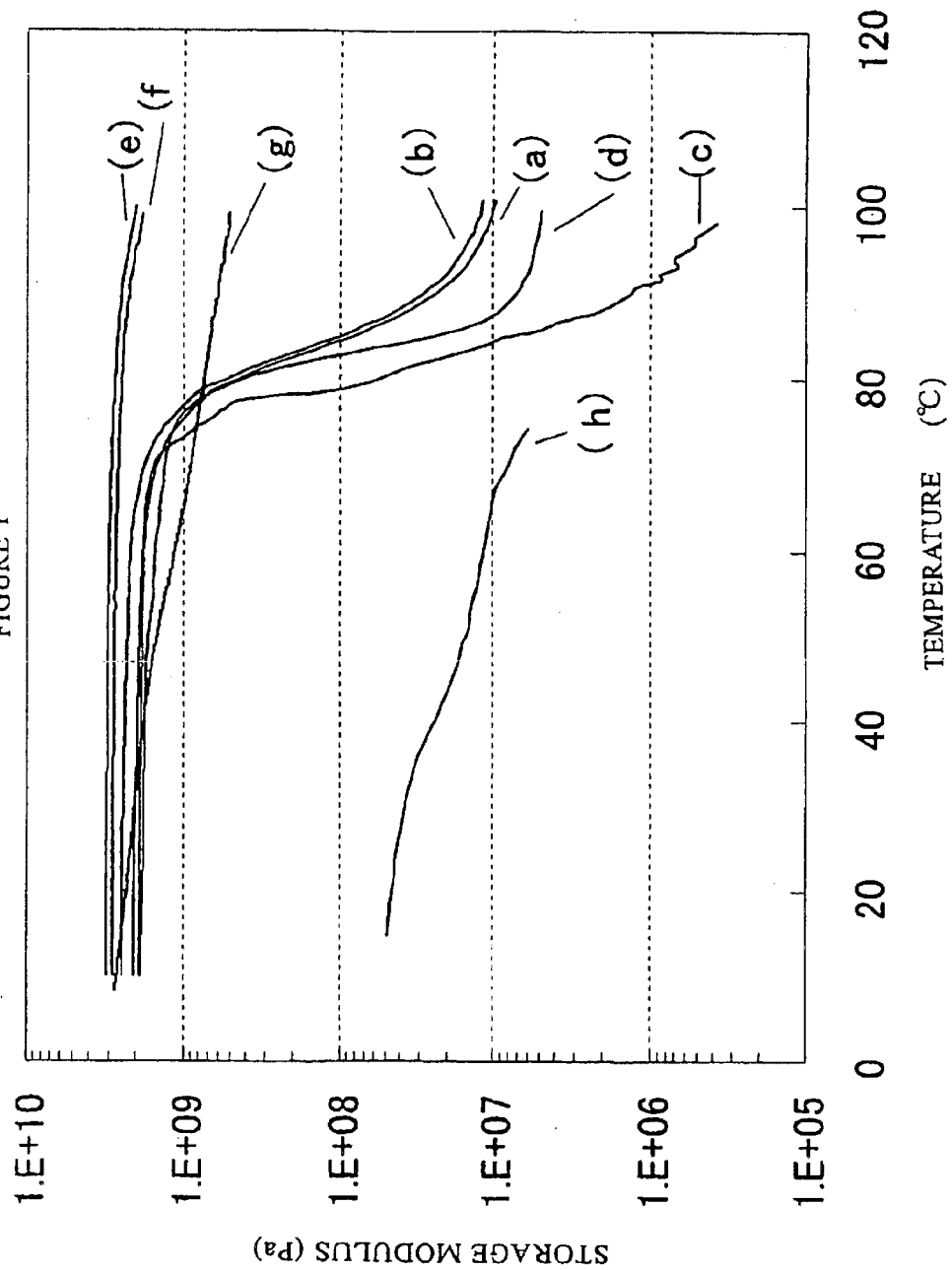
FIG. 1 shows a temperature distribution concerning storage modulus of various substrate films.

DESCRIPTION OF NUMERALS (a): a nitrile resin film with the thickness of 70 $\mu$m (b): a nitrile resin film with the thickness of 175 $\mu$m (c): a cyclic polyolefin film with the thickness of 70 $\mu$m (d): a non-crystalline polyethylene terephthalate film with the thickness of 100 $\mu$m (e): a biaxially stretched polyethylene terephthalate film with the thickness of 70 $\mu$m (f): a biaxially stretched polyethylene terephthalate film with the thickness of 175 $\mu$m (g): a biaxially stretched polypropylene film with the thickness of 70 $\mu$m (h): a ethylene vinyl acetate copolymer film with the thickness of 120 $\mu$m

DESCRIPTION OF THE PREFERRED EMBODIMENTS

Details will be described herein after concerning the present invention. The adhesive film for protecting the surface of a semiconductor wafer of the present invention comprises substrate film, wherein an adhesive layer is formed on one surface of the substrate film. The adhesive film for protecting the surface of a semiconductor wafer of the present invention is to be used in the non-circuit-formed surface processing of semiconductor wafers wherein the surface where circuits of semiconductor wafers are not formed (hereinafter referred to as "back surface") is processed after adhering the adhesive film for protecting the surface of a semiconductor wafer to the surface where circuits of semiconductor wafers are formed (hereinafter referred to as "front surface") through an adhesive layer generally at around room temperature, that is, around 18 to 30° C. and then the adhesive film for protecting the surface of a semiconductor wafer is peeled off by heating.

First an explanation is provided for an adhesive film for protecting the surface of a semiconductor wafer of the present invention (hereinafter referred to as "adhesive film"). The adhesive film of the present invention is produced by forming a substrate film and then forming an adhesive layer on one surface of the substrate film. A peeling film is attached to the surface of adhesive layers in general. The way of forming adhesive layers is exemplified by: forming an adhesive layer by coating an adhesive agent on one surface of a peeling film and dehydrating, then transferring to one surface of a substrate film; forming an adhesive layer by coating an adhesive agent to one surface of a substrate film and dehydrating, and so on. As for the forming, the peeling film should be peeled off at the time of usage. As for the latter way, it is preferable to attach the peeling film on the surface of adhesive layers to protect from stains caused by environmental elements.

Whether the adhesive agent should be applied to a substrate film or peeling film should be decided in light of heat resistance of both films as well as in light of the cleanliness of the surface of semiconductor wafers. For example, if the heat resistance of the peeling film is superior to that of the substrate film, the adhesive layer should be formed on the surface of the peeling film and transferred to the substrate film. If the heat resistances of the both film are equal, or the heat resistance of substrate film is superior, the adhesive layer should be formed on the surface of the substrate film and the peeling film attached to the surface of the adhesive layer.

However, in light of the adhesive film being adhered to the surface of semiconductor wafers through the surface of adhesive layer which is exposed when a peeling film is peeled off, it is preferable for protecting the surface of semiconductor wafers from stains by selecting adhesive layers and peeling films with good heat resistance regardless of the degree of the heat resistance of the substrate film, coating the adhesive agent to the surface thereof and dehydrating to obtain an adhesive layer.

The substrate film to be used in the adhesive film concerning the present invention is characterized in that it satisfies the following requisites (A) and at least one of (B) or (C). More specifically it is characterized in that a substrate film which satisfies two requisites consisting of (A) and (B), or two requisites consisting of (A) and (C), or three requisites consisting of (A), (B) and (C) should be used in this invention:

high rigidity properties wherein the bending resistance value of the film is within the range of 0.08 to 1.50 N and preferably 0.1 to 1.0 N at a temperature of 50° C. and preferably within the total range of 18° C. to 50° C. (hereinafter referred to as "requisite (A)").

properties wherein the bending resistance value of the film at a temperature of 90° C. or preferably the bending resistance value within part of the range of from 50 to 90° C. is one third or less of that at a temperature of 50° C., and more preferably one third or less of the maximum film bending resistance value under the range of from 18 to 50° C., further preferably one fifth or less (hereinafter referred to as "requisite (B)").

high elastic modulus properties with expansibility by water absorption wherein the size-changing ratio after absorbing water for four hours at a temperature of 23° C. with relative humidity(RH)90% is 0.05 to 0.5%, preferably 0.1 to 0.5% (hereinafter referred to as "requisite (C)").

The substrate film to be used in adhesive film concerning another invention provided in the present invention is characterized in that at least one layer of the substrate film satisfies the following requisites (A') and at least one of (B') or (C). More specifically, it is characterized in that a substrate film comprising at least one layer which satisfies the following two requisites (A') and (B'), or (A') and (C), or three requisites (A'), (B') and (C) should be used in this invention:

high elastic modulus properties (A') wherein the storage modulus is $1\times10^9$ Pa to $1\times10^{10}$ Pa, under the total temperature range of from 18 to 50° C., and preferably within the range of $1\times10^9$ Pa to $7\times10^9$ Pa (hereinafter referred to as requisite (A')).

high elastic modulus properties (B') wherein the storage modulus is not more than $1\times10^8$ Pa under at least part of the temperature range of from 50 to 90° C., and more preferably not more than $5\times10^7$ Pa (hereinafter referred to as requisite (B')).

The above requisite (B') preferably has the storage modulus not more than $1\times10^8$ Pa under at least part of the temperature range of more than 50 to 90° C. and more preferably not more than $1\times10^7$ Pa.

Furthermore, it is preferable that at least one layer comprised in a substrate film which satisfies the requisites (A), and at least one of (B) or (C), satisfies the requisite (A') and at least one of requisite (B'), or the requisite (C).

Because the substrate film of the adhesive film satisfies said two requisites (A) and (B), its rigidity can hold down the elongation of the substrate film in adhering the adhesive film for protecting the surface of a semiconductor wafer to the surface of semiconductor wafers, straightening warpage of wafers caused by the residual stress from a circuit protection film formed on the surface of semiconductor wafers to prevent damage to wafers. When the adhesive film is peeled from the wafer surface, it can be easily peeled without damaging wafers by heating it to from about 50 to 90° C. because the rigidity of the substrate film can be depressed by this heating.

In case the value of film bending resistance goes beyond the range of 1.50 N under the total temperature range of from 18 to 50° C., it may become difficult to adhere the adhesive film to the surface of semiconductor wafers because of its excessive rigidity. If the value of bending resistance under the total temperature range of from 18 to 50° C. is less than 0.08 N, it may happen that the effect of straightening the warpage in the circuit protection film for semiconductor wafers deteriorates.

Also, when at least one layer of the substrate film for the adhesive film satisfies said two requisites (A') and (B'), its rigidity can hold down the elongation of the substrate film in adhering the adhesive film for protecting the surface of a semiconductor wafer to the surface of semiconductor wafers, which is effective to straighten the warpage of wafers caused by the residual stress of circuit protection films formed on the surface of semiconductor wafers, preventing damage to wafers. Also the adhesive film can easily be peeled from the surface of wafers without damaging them by heating to from around 50 to 90° C. because the rigidity of the substrate film can be depressed by this heating.

If the storage modulus of at least one resin layer with high elastic modulus comprised in the substrate film, goes beyond $1 \times 10^{10}$ Pa under the total temperature range of from 18 to 50° C., it may become difficult to adhere the adhesive film to the surface of semiconductor wafers due to its excessive rigidity. If the storage modulus is less than $1 \times 10^9$ Pa under the total temperature range of from 18 to 50° C., the effect of straightening the warpage of circuit protection films on semiconductor wafers may deteriorate. The lower limit storage modulus of the resin layer with high elastic modulus which satisfies the above requisite (B') is preferably around $1 \times 10^5$ Pa at a temperature within the range of from 50 to 90° C.

If the substrate film of the adhesive film satisfies said two requisites (A) and (C), its rigidity can depress the elongation of the substrate film in adhering the adhesive film for protecting the surface of a semiconductor wafer to the surface of semiconductor wafers, which is effective to straighten the warpage of wafers caused by the residual stress of circuit protection film formed on the surface of semiconductor wafers to prevent damage to wafers.

Also in the grinding process for the back surface of wafers, the substrate film expands by absorbing water used for washing the surface of the adhesive film or coolant poured to cool wafers (hereinafter referred to as grinding water), and it becomes possible to straighten warpage of wafers by using this expansion force. In this case, even a thin substrate film can obtain very effective warpage-straightening performance. If the bending resistance goes beyond 1.5 N under total temperature range of from 18 to 50° C., it may become difficult to adhere the adhesive film for protecting the surface of a semiconductor wafer to the surface of semiconductor wafers due to its excessive rigidity.

Also if the bending resistance is less than 0.08 N under the total temperature range of from 18 to 50° C., it may happen that the effect of straightening warpage of circuit protection films for semiconductor wafers deteriorates. If the size-changing ratio after absorbing water for four hours is less than 0.05% under the conditions of 23° C. with RH(relative humidity) 90%, the effect of straightening warpage of wafers by force of expansion will deteriorate. When the size-changing ratio is beyond 0.5%, it may happen that the adhesive film may deform after completion due to absorbing atmospheric moisture over time after completion of the adhesive film.

Also, when at least one layer of the substrate film for the adhesive film satisfies said two requisites (A') and (C), its rigidity can hold down the elongation of the substrate film in adhering the adhesive film for protecting the surface of a semiconductor wafer to the surface of semiconductor wafers, which is effective to straighten the warpage of wafers caused by the residual stress of circuit protection films formed on the surface of semiconductor wafers to prevent from damaging wafers. If it satisfies the requisite (C), in the grinding process of the back surface of a wafer, the substrate film expands by absorbing water for washing the surface of adhesive film or coolant to cool wafers (hereinafter referred to as grinding water) and it becomes possible to straighten the warpage of wafers by force of expansion. In this case, even a thin substrate film can obtain very effective warpage-straightening performance for wafers.

If the substrate film of the adhesive film satisfies said three requisites (A), (B) and (C), all effects of satisfying (A) and (B) as well as satisfying (A) and (C) are multiplied in total. Therefore, it is preferable to satisfy all of said three requisites (A), (B) and (C) in light of the problem to be solved in this invention.

If at least one layer of the substrate film for the adhesive film satisfies said three requisites (A'), (B') and (C), all effects of satisfying (A') and (B') as well as satisfying (A') and (C) are multiplied in total. Therefore, it is preferable in light of this application's problem to be solved that at least one layer of the substrate film for the adhesive film satisfies said three requisites (A'), (B') and (C).

The substrate film to be used for the adhesive film of the present invention may be formed exclusively by resin layers which satisfy said requisites (A') and (B'), or (A') and (C), or (A') and (B') and (C), or may be formed by resin layers wherein at least one layer of the substrate film satisfies said requisites and the other layers don't satisfy any of said requisites. That means, it may be a multilayer film comprising a resin layer with said requisites and other layers. If the substrate film is formed by laminating with other resin layers, it is preferable to design constitution in light of such elements as the resin's water absorption properties. For example, when a resin with low water absorption properties is laminated with a resin satisfying said requisite (C), the resin layer satisfying said requisite (C) is preferably formed on the outmost layer.

The layer satisfying (A') and at least one of (B') or (C) in substrate film to be used in the adhesive film concerning the present invention preferably satisfies the requisite in which the proportion of maximum storage modulus value(E'max) against minimum storage modulus value(E'min), that is, "E'max/E'min" within the temperature range of from 18 to 50° C. is 1.0 to 1.1, in addition to said requisite (A'). If said proportion of maximum storage modulus value(E'max) against minimum storage modulus value(E'min), that is, "E'max/E'min" goes beyond said value range, it may happen that warpage of semiconductor wafers deteriorate after completion of back surface processing because of shrinkage or deformation of the substrate film caused by grinding heat during the back surface processing for semiconductor wafers. If the thickness of a resin layer with high elastic modulus is thick, when the storage modulus thereof goes beyond $1\times10^8$ Pa under the total temperature range of from 50 to 90° C., it becomes difficult to peel the adhesive film for protecting the surface of a semiconductor wafer.

In light of those effects such as restraining elongation of the substrate film in adhering the adhesive film to the surface of semiconductor wafers and straightening or preventing warpage of wafers caused by the residual stress of circuit protection films formed on the surface of semiconductor wafers, the thickness of the resin layer with the above requisites is 30 to 300 μm, and further preferably 30 to 200 μm. The resin layer with the above requisites may be only one layer or may be more than one layer. If the number of the layer is more than one, the thickness of the respective layers with the above requisites should be comparatively thin so that the total thickness can be contained within the range from 30 to 300 μm.

A resin having the above requisites (A') and (B'), for example, is exemplified by nitrile resin, cyclic polyolefin resin (manufactured by Mitsui Chemicals, Inc., trade name: APEL), non-crystalline polyethyleneterephthalate (manufactured by Mitsubishi Plastics, Inc., trade name: PET-G) and so on. Hereinafter is described a nitrile resin which is preferably used as a resin having the above requisite (A') and (B'). Said nitrile resin is manufactured by graft-copolymerizing unsaturated nitrile, alkyl (meth) acrylate, and monomer compounds consisting of other monomers which can be copolymerized with those if necessary, under the existence of rubbery polymer. The rubbery polymer used for manufacturing nitrile resin is a polymer which consist of conjugated diene unit, or a copolymer which comprises conjugated diene unit and a monomer unit which comprises conjugated diene and monomer exemplified by unsaturated nitrile, aromatic vinyl compound, unsaturated carboxylic acid ester and so on.

Conjugated diene is exemplified by 1,3-butadiene, isoprene, chloroprene, 2,3-dimethyl-1,3-butadiene, 2,3-diethyl-1,3-butadiene. In light of broad accessibility and polymeric advantage, 1,3-butadiene and isoprene is preferable. Unsaturated nitrile is exemplified by acrylonitrile, methacrylonitrile and α-chloroacrylonitrile, and acrylonitrile and methacrylonitrile are preferable. Aromatic vinyl compound is exemplified by styrene, α-methylstyrene. Unsaturated carboxylic acid ester can be exemplified by alkyl acrylate which comprises alkyl group with one to four carbons or alkyl methacrylate, preferably methyl (meth) acrylate and ethyl (meth)acrylate.

More specifically, rubbery polymer is preferably exemplified by poly(1,3-butadiene), 1,3-butadiene acrylonitrile copolymer, 1,3-butadiene-acrylonitrile-methacrylonitrile copolymer, 1,3-butadiene-acrylonitrile-styrene copolymer and 1,3-butadiene-styrene copolymer. More preferably are poly(1,3-butadiene), 1,3-butadiene-acrylonitrile copolymer, 1,3-butadiene-styrene copolymer.

The proportion of conjugated diene unit included in these rubbery polymers affects shock resistance of the obtained nitrile resin. In light of this, it is preferable to include more than 50 weight percent of conjugated diene unit, and more preferably more than 60 weight percent in the rubbery polymer. The proportion of rubbery polymer included in the nitrile resin affects the resin's moldability and workability, etc. Shock resistance deteriorates when the proportion of rubbery polymer is less than 3 weight percent, while moldability and workability deteriorates when the proportion goes beyond 30 weight percent. In light of these points, the proportion of rubbery polymer against the total nitrile resin is preferably 3 to 30 weight percent, and more preferably 5 to 20 weight percent. Though rubbery polymer can be manufactured by conventional methods, emulsion polymerization method is preferable. Even though there is no particular limit to polymerization temperature, the range of from 30 to 70° C. is preferable in light of polymerization velocity, productivity and so on.

As a monomer used for graft copolymerization conducted under existence of the above rubbery polymers, unsaturated nitrile, alkyl (meth) acrylate as well as other monomers which can be copolymerized with those if necessary. Unsaturated nitrile used as a monomer for graft copolymerization is exemplified by acrylonitrile, methacrylonitrile, α-chloroacrylonitrile and so on, and preferably acrylonitrile and methacrylonitrile. The properties of nitrile resin is affected by the composition of unsaturated nitrile units included in the matrix component. That means, there are influences not only to chemical resistance deteriorating, but also to its rigidity if the proportion of unsaturated nitrile unit is less than 65 weight percent in the matrix component. If more than 80 weight percent is present in the matrix component, moldability and workability deteriorates while color tone and so forth are degraded, discolored to yellow in the forming process. In light of these points, unsaturated nitrile unit is preferably included in an amount of 65 to 80 weight percent in the matrix component, and more preferably 70 to 80 weight percent.

Alkyl (meth)acrylate used as a monomer for graft copolymerization is exemplified by methyl(meth)acrylate, ethyl (meth)acrylate, propyl(meth)acrylate, butyl(meth)acrylate and so on. The properties of nitrile resin obtained from alkyl(meth)acrylate changes depending on the kinds of alkyl group included in the alkyl(meth)acrylate. In order to highly stabilize the solid state properties of the nitrile resin to be obtained, methyl(meth)acrylate or ethyl(meth)acrylate is preferable.

As other monomers which can be copolymerized with the above unsaturated nitrile and alkyl(meth)acrylate, aromatic vinyl compound, vinyl ether, vinyl ester and α-olefin and so on are exemplified. As aromatic vinyl compound, styrene, α-methyl styrene, vinyl toluene, vinyl xylene and so on, as vinyl ester, vinyl acetate, vinyl propionate, vinyl butyrate, as vinyl ether, methyl vinyl ether, ethyl vinyl ether, propyl vinyl ether, butyl vinyl ether, methyl isopropenyl ether, ethyl isopropenyl ether and so on, as α-olefin, isobutene, 2-methyl-1-butene, 2-methyl-1-pentene, 2-methyl-1-hexene, 2-methyl-1-heptene, 2-methyl-1-octene, 2-ethyl-1-butene, 2-propyl-1-butene, and so on are exemplified. Styrene is preferable among them.

The composition of alkyl(meth)acrylate units included in matrix component and monomer units which can be copolymerized with these to be used if necessary affects the solid state properties of nitrile resin. More specifically, if the total proportion of alkyl(meth)acrylate unit included in matrix component and monomer units which can be copolymerized is less than 20 weight percent, moldability and workability will deteriorate. If the proportion goes beyond 35 weight percent, the storage modulus deteriorates. In light of these points, alkyl(meth)acrylate units and monomer units which can be copolymerized with those are preferably included in the matrix component by 20 to 35 weight percent in total, and more preferably 20 to 30 weight percent.

Unsaturated nitrile and other monomer units which can be copolymerized with alkyl(meth)acrylate may be included in the matrix component up to about 20 weight percent. Since the properties of nitrile resin to be obtained is not seriously affected under 20 weight percent or less, it can be used according to each purpose.

The known copolymerization methods such as emulsion polymerization, solution polymerization, suspension polymerization, block polymerization, or combination of those can be applied to the above nitrile resin. However, emulsion polymerization is preferably applied in light of the easiness of removing polymerization heat, aftertreatment of polymerization, simplification of incidental facilities for recovering and reproducing organic solvent and so on. In case of emulsion polymerization method, since the polymer product is obtained in latex, the obtained product is coagulated by the conventionally known methods such as condensation method through electrolyte or solvent, freezing method and so on, and separated, wet-cleaned and dried to obtain the resin.

Surface active agent to be used in graft copolymerization process is exemplified by at least one kind of anionic surface active agent which is chosen from the group of fatty acid salt, alkyl sulfate, alkyl benzenesulfonate, alkyl naphthalene sulfonate, alkyl sulfosuccinate, alkyl diphenyl ether disulfonate, alkyl phosphate, polyoxyethylene alkyl sulfonate, polyoxyethylene alkyl allyl sulfate, polycondensation of naphthalenesulfonate formaldehyde, polyoxyethylene alkyl phosphate. The surface active agent remaining in the obtained resin, in order to achieve an antistatic effect, is preferably included in the nitrile resin in an amount of 0.05 to 2 weight percent and is affected by the degree of coagulation, separation and wet-cleaning treatments.

Since there is no particular limit on the temperature for copolymerization, it can be conducted at any temperature of from 0 to 100° C. The temperature range of from 30 to 70° C. is preferable in light of polymerization velocity, inversion rate, productivity and so on. Also it is possible to include a plasticizer, stabilizer, lubricant, dye and pigment, filler and so on according to need.

The resin having the above requisite (A') and (C) is exemplified by non-crystalline polyester such as above nitrile resin, cyclic polyolefin, non-crystalline polyethylene terephthalate and so on, and PES (poly(ether sulphone)). The rigidity of resin layer satisfying the said requisite (C) (high elastic modulus properties with expansibility by water absorption) deteriorates a little bit by absorbing water. For example, it gets a little soft upon contact with grinding water used for grinding the back surface of wafers by absorbing water. Due to this, the peeling properties of the adhesive film becomes good after completion of back grinding of wafers.

Non-crystalline polyester is exemplified by non-crystalline polyethylene terephthalate film and so on. As a commercial item, trade name:DIAFIX, Manufactured by Mitsubishi Plastics, Inc. and so on are exemplified. Also, the resin satisfying the above three requisites (A'), (B') and (C) is exemplified by said nitrile resin, cyclic polyolefin, non-crystalline polyester and so on.

The total thickness of the substrate film is preferably 50 to 300 $\mu$m, more preferably 50 to 200 $\mu$m. It may happen that the protection performance for the wafer in grinding the back surface thereof will deteriorate as well as warpage-lowering effect for semiconductor wafers will deteriorate if the total thickness is less than 50 $\mu$m.

If the thickness goes beyond 300 $\mu$m, wafers may be deeply deflected like a convex-shape with the circuit upside after completion of back grinding or peeling of the adhesive film may become difficult. There may occur a problem such as deterioration of adhering workability when adhering the adhesive film to the surface of semiconductor wafers.

In a substrate film to be used in the adhesive film concerning the present invention, a resin layer with low elastic modulus can be laminated on the resin layer base which satisfies the above requisites for absorbing pulse of back surface processing or faulting of the surface of semiconductor wafers. The "low elastic modulus" in the present invention means that the resin has a storage modulus of lower than $1 \times 10^9$ Pa within the total temperature range of from 18 to 50° C. This resin layer with low elastic modulus is exemplified by ethylene-vinyl acetate copolymer, ethylene-alkyl acrylate copolymer (the number of carbons for alkyl group: 1 to 4) and so forth. Among them, ethylene-vinyl acetate copolymer is preferable. What is more preferable is ethylene-vinylacetate copolymer which includes vinyl acetate units by 5 to 50 weight percent.

The thickness of low elastic modulus film layer is preferably 30 to 250 $\mu$m, and more preferably 30 to 150 $\mu$m. It may not absorb faulting of the surface of wafers enough if the thickness is less than 30 $\mu$m. If the thickness is beyond 250 $\mu$m, the thickness of semiconductor wafers may vary widely after the back surface processing for wafers, so as to have ill effects to the quality of semiconductor wafers.

The representative producing method of a substrate film is exemplified by T-die extrusion method, inflation method, calendar method and so on. To manufacture a multilayer film comprising at least one resin layer with high elastic modulus which satisfies the above requisites, the producing method is exemplified by: laminating with the above high elastic modulus film prepared beforehand while conducting extrusion molding resins with low elastic modulus such as ethylene vinyl acetate copolymer and soon by an extruder. In order to promote adhesive strength between those multilayer films, one adhesive layer may be newly provided therebetween, or corona discharge treatment or chemical treatment may be conducted. It is preferable to conduct corona discharge treatment or chemical treatment on the surface which adhesive layer is formed. It is preferable to form an adhesive layer on the surface with low elastic modulus of a resin layer if resin layers with low elastic modulus are laminated.

It is preferable that the adhesive layer to be used in the present invention has quite a low contamination properties against the surface of semiconductor wafers. If the surface of wafers are highly contaminated, it is necessary to clean it after peeling the adhesive film. However, there is a high frequency of damaging such thinning-processed wafers by the cleaning process.

The adhesive layer of the present invention generally comprises 100 parts by weight of adhesive polymer having functional group which can react with a cross-linker and 0.1 to 30 parts by weight of cross-linkers having two or more functional groups per molecule. The kind of adhesive agent like this is exemplified by those which have adhesion switching function such as radiation curing, heat curing, cellular by heating and so on, and conventional adhesive agents not having switching function.

The conventional adhesive agent without any switching function is exemplified by crude rubber, synthetic rubber, silicone rubber and acrylic adhesive agents comprising alkyl acrylate, alkyl methacrylate and soon. Acrylic adhesive agent is preferable among them in light of controlling adhesive properties and reproducibility.

Main monomer of adhesive polymer is, in case of acrylic adhesive agent, preferably those comprising alkyl acrylate and alkyl methacrylate. Alkyl acrylate and alkyl methacrylate are exemplified by methyl acrylate, methyl methacrylate, ethyl acrylate, ethyl methacrylate, butyl acrylate, butyl methacrylate, 2-etylhexyl acrylate. Those can be used independently and by mixture of two or more. The main monomer is preferably included in the total monomers of adhesive polymer by range from 60 to 99 weight percent. By using a monomer mixture with such composition, a polymer can be obtained which includes alkyl acrylate unit, alkyl methacrylate unit, or mixture units of these with nearly the same composition.

It is preferable that the adhesive polymer has a functional group which can react with a cross-linker. The functional group which can react with a cross-linker is exemplified by hydroxy group, carboxyl group, epoxy group and amino group. As for the method of introducing a functional group reactive to these cross-linkers into adhesive polymer, one can generally copolymerize with monomers having these functional groups in the polymerization process for the adhesive polymer.

For example, acrylic acid, methacrylic acid, itaconic acid, mesaconic acid, citraconic acid, fumaric acid, maleic acid, mono alkyl itaconate, mono alkyl mesaconate, mono alkyl citraconate, mono-alkyl fumarate, mono-alkyl maleate, 2-hydroxy-ethyl acrylate, 2-hydroxyethyl methacrylate, acrylamide, methacrylamide, t-butyl aminoethyl acrylate, t-butylamino ethyl methacrylate and so on can be exemplified. Only one kind of comonomer can be used to copolymerize with the above main monomer, as well as two or more can be used for copolymerization. It is preferable that the amount of monomer which comprises the functional group reactive with the above cross-linkers(that is, the amount of copolymerization) is included in the total monomers of adhesive polymer within the range from 1 to 40 weight percent. By using monomer mixture with such composition, a polymer can be obtained which includes comonomer units with nearly the same composition.

In this invention, not only the main monomer units having the above adhesive polymer and comonomer units having a functional group reactive with cross-linkers, but also specific comonomer having surface active agent properties (hereinafter referred to as "polymeric surface active agent" may be copolymerized. In case the surface of a wafer is stained due to the adhesive layers, it can be easily removed by wet-cleaning because the polymeric surface active agent has the properties to copolymerize with the main monomer and comonomers.

Such polymeric surface active agent is exemplified by, for example, what induces a polymeric 1-propenyl group into benzene ring of polyoxyethylene nonylphenyl ether [manufactured by Dai-ichi Kogyo Seiyaku Co, Ltd.; trade name: AQUALON N-10, ditto RN-20, ditto RN-30, ditto RN-50 and so on], what induces polymeric 1-propenyl group into benzene ring of ammonium salt of polyoxyethylene nonylphenyl sulfate [manufactured by Dai-ichi Kogyo Seiyaku Co, Ltd.; trade name: AQUALON HS-10, ditto HS-20 and so on], and di-sulfosuccinate which has polymeric double bond [manufactured by Kao Corporation; trade name: LATEMUL S-120A, ditto S-180A and so on].

Furthermore, if necessary, monomers having functional groups with self cross-linking properties such as glycidyl acrylate, glycidyl methacrylate, isocyanate ethyl acrylate, isocyanate ethyl methacrylate, 2-(1-aziridinyl)ethylacrylate, 2-(1-aziridinyl)ethyl methacrylate and so on; monomers having polymeric double bond such as vinyl acetate, acrylonitrile, styrene and so on; and polyfunctional monomers such as divinyl benzene, vinyl acrylate, vinyl methacrylate, allyl acrylate, allyl methacrylate and so on, may be copolymerized.

Polymerization mechanism of an adhesive polymer is exemplified by radical polymerization, anion polymerization, cation polymerization. Radical polymerization is preferable in light of the cost of manufacturing adhesive agent, effects of monomer's functional group, ion effects to the surface of semiconductor wafers and so on. Radical polymerization initiator used for the process of radical polymerization is exemplified by organic peroxide such as benzoyl peroxide, acetyl peroxide, isobutyryl peroxide, octanoyl peroxide, di-t-butyl peroxide, di-t-amyl peroxide and so on; inorganic peroxide such as ammonium persulfate, potassium persulfate, sodium persulfate and so on, and; azo compound such as 2,2-azobis(isobutyronitrile), 2,2'-azobis(2-methyl butyronitrile), 4,4'-azobis(4-cyano valeric acid) and so on.

Method of polymerizing adhesive polymers is exemplified by emulsion polymerization method, suspension polymerization method, and solution polymerization method. Emulsion polymerization method is preferable among them. If adhesive polymer is polymerized with emulsion polymerization method, water-soluble inorganic peroxide such as ammonium persulfate, potassium persulfate, sodium persulfate and so on as well as water-soluble azo compound having carboxyl group such as 4,4'-azobis(4-cyano valeric acid) and so on, are preferable among those radical polymerization initiators. In light of ion effects to the surface of semiconductor wafers, ammonium persulfate and azo compound having carboxyl group such as 4,4'-azobis(4-cyano valeric acid) and so on is more preferable. Azo compound having carboxyl group such as 4,4'-azobis(4-cyano valeric acid) and so on is particularly preferable.

The cross-linker having two or more functional groups with cross-linking reactive properties per molecule to be used in the present invention is used to adjust the density of cross-linkage, adhesive strength and cohesive force by reacting with a functional group included in the adhesive polymer. The cross-linker is exemplified by epoxy cross-linkers such as sorbitol poly glycidyl ether, poly glycerol poly glycidyl ether, pentaerythritol polyglycidyl ether, di-glycerol poly glycidyl ether, glycerol poly glycidyl ether, neopentyl glycol di glycidyl ether, and resorcinol diglycidyl ether; aziridine carboxy cross-linkers such as trimethylol propane-tri-β-aziridinyl propionate, tetramethylolmethane tri-p-aziridinyl propionate, N,N'-diphenyl methane 4,4'-bis (--aziridine carboxy amide), N,N'-hexamethylene 1,6-bis(-aziridine carboxy amide), N,N'-toluene 2,4-bis (1-aziridine carboxy amide), trimethylol propane-tri-β-(2-methyl aziridine)propionate, and; isocyanate cross-linkers such as toluene diisocyanate, tetramethylene diisocyanate, hexamethylene diisocyanate, tri-adduct of toluene diisocyanate of trimethylolpropane, and polyisocyanate and so on. These cross-linkers can be used independently as well as used together by two kinds or more.

If the adhesive agent includes water (including emulsion), it may happen that the cross-linkage reaction by isocyanate cross-linker with adhesive polymers does not promote adequately because it tends to lose its effects promptly by side reaction with water. Therefore it is preferable in this case to use aziridine or epoxy type among the above cross-linkers.

The proportion of cross-linker in the present invention having cross-linking reactive functional groups of two or more per molecular is 0.1 to 30 parts by weight against 100 parts by weight of adhesive polymer, and particularly preferably 0.5 to 25 parts by weight. If the proportion of included cross-linker is not enough, cohesive force of adhesive layers may become deficient to cause stains on the surface of wafers. If too much, it may happen that adhesive strength between the adhesive layer and the surface of a wafer deteriorates, water and grinding waste intrudes on the back grinding process to damage wafers or cause stains on the surface of wafers.

The adhesive agent in the present invention used for forming the adhesive layer may comprise, not only the adhesive polymer having functional group reactive with the above cross-linker and the cross-linker having two or more cross-linking reactive functional group per molecule, but also proper amounts of tackifier such as rosin resin, terpene resin as well as each kind of surface active agent and so on to control the adhesive properties. If the adhesive polymer is an emulsion liquid, coalescing agent such as diethylene glycol monobutyl ether and so on may be comprised as one thinks it proper, to such degree that it may not affect the object of the present invention.

Also, the adhesive layer can become a radiation curing adhesive agent by applying monomer ingredient, oligomer ingredient and polymerization initiator into the adhesive agent. In case of using this radiation curing adhesive agent, said adhesive agent is cured by irradiating radiation such as ultra-violet wave before peeling the adhesive film from the surface of semiconductor wafers to decrease the adhesive strength.

The thickness of adhesive layer affects the staining properties, adhesive strength and so on of the surface of semiconductor wafers. If the thickness of the adhesive layer become thin; stain may be retained on the surface of wafers. If the thickness of adhesive layer is too thick, the adhesive strength may be enhanced to deteriorate the workability in peeling process. In light of these points, the thickness of adhesive layer is preferably 1 to 100 $\mu$m.

In forming the adhesive layer on one surface of substrate film in the present invention, the method can be applied in which the above adhesive agent is used as a solution or an emulsion liquid (hereinafter generically referred to as "adhesive agent coating solution") for coating and dehydrating to obtain adhesive layers according to the conventionally public methods such as roll coater, commma coater, die coater, mayerbar coater, reverse roll coater, gravure coater and so on. In this case, it is preferable to attach the peeling film on the surface of the coated adhesive layers in order to protect it from contamination or so on caused by environmental elements. Another method may be applied in which after forming the adhesive layer by coating and dehydrating the adhesive agent coating solution on one surface of the peeling film according to the above public methods, the adhesive layer is transferred to the substrate film according to the conventional methods such as dry laminate method and so on (hereinafter referred to as "decal transferring method").

Though there is no particular limit to the dehydrating condition in dehydrating the adhesive agent coating solution, it is generally preferable that it is conducted within the temperature range from 80 to 300° C. for 10 seconds to 10 minutes, and more preferably dehydrating within 80 to 200° C. for 15 seconds to 5 minutes. In the present invention, the adhesive film may be heated within the temperature range of from 40 to 80° C. for about 5 to 300 hours after completion of dehydrating the adhesive agent coating solution in order to fully promote cross-linkage reaction between the cross-linker and the adhesive polymer.

The adhesive strength of the adhesive film affects both of protective properties for a wafer in the back grinding and chemical solution processes and the workability in peeling from the wafer. In light of the wafer's protective properties in back grinding and chemical solution processes (prevention of intrusion of grinding water, grinding waste and chemical solution, etc.), it is preferable that the adhesive strength measured under the condition of film peeling velocity 300 mm/min, peeling angle of 180°, using SUS304-BA board as adhered in conformity to the way regulated by JIS Z-0237 is 10 to 700 g/25 mm, and more preferably 10 to 500 g/25 mm.

Though the method of producing the adhesive film concerning the present invention is as stated above, in light of preventing from stain on the surface of semiconductor wafers, it is preferable that the standards of cleanliness is kept within the class of 1,000 or below which is regulated by US Federal Standard 209b with manufacturing environment for all ingredients and materials comprising substrate films, peeling films and adhesive agents, with controlling, preserving, coating and dehydrating environments for the adhesive agent.

Next is described the way of back surface processing of semiconductor wafers concerning the present invention. It is characterized by using the above adhesive film in conducting grinding process, chemical etching process or in conducting both of those operations at the same time against the non-circuit-formed surface of semiconductor wafers. More specifically, at around room temperature, 18 to 30° C. in general, the peeling film is peeled off from the above adhesive film to expose the surface of the adhesive layer, said adhesive film being adhered on the surface of the semiconductor wafer through the adhesive layer. The semiconductor wafer is next fixed to a chuck table of grinding machine or so on through the substrate film layer of the adhesive film, conducting grinding process, chemical etching process and so on against the back surface of semiconductor wafers. In the present invention, each one of the grinding process or chemical etching process can be conducted independently, or both of them can be conducted together. In conducting both processes, the conducting order is not particularly regulated, but generally the first is the grinding process and the second is the chemical etching and so on.

After the completion of the grinding process, chemical etching and soon, said adhesive film is peeled off. In any back surface processing methods, such aftertreatment as wet-cleaning, plasma-cleaning,etc. may be conducted on the surface of semiconductor wafers if necessary after peeling the adhesive film. Under those series of processes including the grinding process, chemical etching process, etc. on the back surface of semiconductor wafers, by applying the method of the present invention, the thickness of the semiconductor wafers can be thinned down to 150 $\mu$m or less without troubles such as damaging, though the general thickness of semiconductor wafers before grinding process is 500 to 1000 $\mu$m. It can be thinned to the degree of 100 $\mu$m or less, or in some cases even to around 50 $\mu$m depending on the kind of semiconductor chips. The thickness of the wafer after the back grinding process and the thickness after the chemical etching can be fitly decided in light of the kind of semiconductor wafers and desired final thickness, and so on. The thickness of semiconductor wafers before back grinding is fitly decided by the bore, kind and so on of semiconductor wafers, and the thickness thereof before the back grinding is fitly decided by the kind, application and so on of circuits to be obtained.

The operation of adhering the adhesive film to semiconductor wafers is generally conducted by device denominated as automatic adhering machine comprising roll adhesive film, though it may be manually operated in some cases.

Automatic adhering machine like this is exemplified by format of ATM-1000B, ATM-1100 manufactured by Takatori Corp., format of DR8500II manufactured by Nitto Seiki Co., Ltd., and format of STL series manufacture by Teikoku Seiki Co., Ltd.

There is no particular limit to the way of back grinding process for semiconductor wafers, and the public grinding methods such as through-feed method and in-feed method can be applied. The grinding of the back surface of wafers is preferably conducted by cooling the semiconductor wafers and grind stone with water. The grinding machine for grinding the back surface of wafers is exemplified by format of DFG-841, DFG-850 and DFG-860 manufactured by Disco Corp., format of SVG-502MKII manufactured by Okamoto Machine Tool Works, Ltd. and so on.

Chemical etching process is exemplified by chemical solution treatment, method of conducting chemical etching and back grinding denominated as CMP at the same time, plasma etching and so on. For example, in chemical solution treatment is used an etching solution which is chosen from group comprising aqueous acids, alkaline solutions and so on, said aqueous acids comprising hydrofluoric acid, nitric acid, sulfuric acid, acetic acid and so on in unmingled condition or in admixture, said alkaline solution comprising potassium hydroxide solution, sodium hydroxide solution and so on. The chemical solution method is exemplified by dipping method in which a wafer in whole is dipped into chemical solution, spin etching method in which the back surface of a wafer is selectively touched in the chemical solution by spinning it, and so on.

After completion of back grinding process, chemical solution treatment and so on of wafers, the adhesive film is peeled off from the surface of wafers. The operation of peeling the adhesive film from the surface of wafers is generally conducted by a device denominated as automatic peeling machine, though may be sometimes manually operated. In the operation by automatic peeling machine, the adhesive film is peeled off by fixing a thinning-processed wafer to a vacuum chuck table. In peeling the adhesive film, it is important to heat the adhesive film through the chuck table. The preferred heating temperature can be selected within the temperature range of from 50 to 90° C. depending on the kind of resin to be used. Peeling of the adhesive film may be conducted in fixed to a dicing tape and so on.

Automatic peeling machine is exemplified by format of ATRM-2000B, or ATRM-2100 manufactured by Takatori Corp., format of HR-8500II manufactured by Nitto Seiki Co., Ltd. format of STP series, manufactured by Teikoku Seiki Co., Ltd. and so on.

As for the semiconductor wafer which can be applied to the adhesive film and the method of back surface processing of semiconductor wafers by using the adhesive film concerning the present invention, not only a silicon wafer, but also wafers of germanium, gallium arsenide (GaAs), gallium phosphorus, gallium arsenide (GaAs)-aluminum and so on are exemplified. The semiconductor wafer to which the adhesive film and method of back surface processing of semiconductor wafers by using it are preferably applied is the one in which circuits are protected with a polyimide protection film. By applying the present invention, the warpage of wafers caused by such protection films can be straightened or prevented even if the thickness of polyimide protection film is around 1 to 20 $\mu$m.

EXAMPLES

Following is the more detailed description of the present invention through examples. In all of the following examples and comparative examples, processes of adjusting and coating of adhesive agent, back grinding of semiconductor silicon wafers as well as peeling of adhesive film for protecting the surface of a semiconductor wafer and so on were conducted under the environment in which the standards of cleanliness regulated by U.S. Federal Standard 209b was kept within the class of 1,000 or below. However, it is to be understood that the present invention is not intended to be limited to these embodiments. The value of various properties illustrated in the examples were measured by the following methods:

1. Method of Measuring Various Properties 1-1. Measuring of Adhesive Strength (g/25 mm)

All measurements, except for the conditions regulated below, should be based on JIS Z-0237.

At 23° C., an adhesive film obtained by the example or comparative example is adhered on the surface of SUS304-BA plate (JIS G-4305 regulation, longitudinal: 20 cm, transversal: 5 cm) through its adhesive layer and is left untouched for an hour. After that, one end of the sample is pinched to be lifted and peeled off from the surface of SUS304-BA plate with the peeling angle: 180°, the peeling velocity: 300 mm/min. to measure the peeling stress and convert the value to "g/25 mm".

1-2. Measuring of Bending Resistance (N)

Sample piece is prepared by cutting out a substrate film in the shape of 20 cm-by-20 cm. Resisting value (N) in crushing the sample piece into the slit by 8 mm is measured by load cell, and recognize this measured value as bending resistance. Hand-O-meter (model: HOM-2, manufactured by DAIEI KAGAKU SEIKI MFG. CO. LTD.) was used for this measuring. It was measured by setting the device at the temperatures of 50° C. and 90° C.

1-3. Storage Modulus (Pa)

A film sheet is made into a strip sample of 30 mm (machine direction)-by-10 mm (right angle direction against machine). The storage modulus of this sample is measured by using a measuring device for dynamic viscoelasticity (manufactured by Rheometric-Scientific F.F. Ltd., model; RSA-II, using the attachment for film-tensile test) under the frequency of 1 Hz, within the temperature range of from 10 to 100° C. More specifically, the sample is set up on the measuring device for dynamic viscoelasticity through the above attachment, and the storage modulus is measured by heating at the programming rate of 3° C./min. from 10° C. to 100° C.

1-4. Size-Changing Ratio (%) by Absorbing Water for the Substrate Film

Pinholes about 1 mm in diameter are made on the film sheet at about 300 mm intervals. Measure the interval of these sample pinholes by using a device for measuring modification of two-dimensional size [manufactured by Mitutoyo Corp., modelformat: CRYSTAL*$\mu$, V-606]. Denominate the measured pinhole interval as "L0". After that, quietly place the sample of which pinhole interval was already measured in a oven set up at 23° C., RH90%. Get said sample out of the oven four hours later and measure the pinhole interval again. Denominate this time's pinhole interval as "L". Calculate the size-changing ratio (%) by the following formula, by measuring ten sheets of samples to get the average, and using its average value:

$$\text{size-changing ratio } (\%) = 100 \times (L-L0)/L0$$

1-5. Warpage of Semiconductor Wafers (mm)

Put a semiconductor silicon wafer of which surface is coated with polyimide [diameter: about 200 mm (8 inches)]

on a flat board with the protected up, to measure the maximum range between the back surface of the wafer and the flat board. Measure ten samples to get the average, and use the average value.

2. Example 1 of Preparing Nitrile Resin 2-1. Preparing Rubbery Polymer

Admixture consisting of the following ingredients was charged into a stainless steel polymerization reactor to polymerize under A nitrogen atmosphere for twenty hours at 45° C. by stirring, the polymerization being finished at the inversion rate 90%. By removing nonreactive monomers by stripping under reduced pressure, rubbery polymer of which solid content density was about 30 weight percent was obtained. Then the solid content was drawn from said polymer solution, being dehydrated, and searched to calculate the contents of 1,3-butadiene unit and acrylonitrile unit against said polymer by elemental analysis, the result being as follows: 1,3-butadiene unit: 71 weight percent; acrylonitrile unit: 29 weight percent.

<preparing ingredient of rubbery polymer: acrylonitrile 30 parts by weight, 1,3-butadiene 70 parts by weight, fatty acid soap 2.4 parts by weight, azobis(isobutyro nitrile) 0.3 parts by weight, t-dodecyl mercaptan 0.5 parts by weight, water 200 parts by weight>

2-2. Preparing of Graft Polymer

The following ingredients (for initial adjunction) were charged into a stainless steel polymerization reactor and heat up to 58° C. under the nitrogen atmosphere by stirring. After stirring for thirty minutes, aqueous solution including potassium persulfate 0.08 parts by weight was added as polymerization-initiator to start the polymerization.

<Ingredients for preparing graft polymer (for initial addition): acrylonitrile 15 parts by weight, ethyl acrylate 5 parts by weight, rubbery polymer in the above (2-2) (as solid content) 10.5 parts by weight, sodium dioctyl sulfosuccinate 0.407 parts by weight, polyvinyl pyrrolidone 0.103 parts by weight, sodium hexametaphosphate 0.035 parts by weight, water 150 parts by weight>

Then phosphoric acid was added after twenty-five minutes from initiating polymerization to adjust pH at 3±0.3; another thirty minutes later, the following composition of ingredients were continuously added for 6.5 hours (for latter stage addition) to continue polymerization at temperature 58° C.

<Ingredients for latter stage addition: acrylonitrile 60 parts by weight, ethyl acrylate 20 parts by weight, pentaerythritol tetrakis (β-mercapto propionate) 1.6 parts by weight, sodium dioctyl sulfosuccinate 1.627 parts by weight, polyvinyl pyrrolidone 0.413 parts by weight, sodium hexameta phosphate 0.141 parts by weight, water 85 parts by weight>

During the addition, phosphoric acid was also added continuously from the beginning for five hours, keeping the pH of polymerization system at 3±0.3 for seven hours to conduct polymerization. Eight hours later from the beginning of polymerization, it was cooled and polymerization process was finished. The total inversion rate was 92.7 weight percent. Then the obtained resin was coagulated by adding aluminum sulfate (concentration: 45 weight percent), washed with water and dehydrated to obtain a powdery nitrile resin.

3. Examples of Preparing a Substrate Film 3-1. Example 1 of Preparing a Substrate Film 1

The nitrile resin obtained by the above section 2 was formed into a film by inflation method to obtain a nitrile resin film with the thickness of 70 μm. Then an ethylene-vinyl acetate copolymer film with the thickness of 50 μm (manufactured by Du Pont-Mitsui Polychemicals Co., Ltd., trade name: EVAFLEX P-1905 (EV460) was laminated on the obtained nitrile resin film. At that time a corona discharge treatment was conducted on the surface of ethylene-vinyl acetate copolymer forming the adhesive layer to prepare a substrate film 1 of which total thickness was 120 μm. FIG. 1 illustrates the temperature distribution value (a) concerning the storage modulus of a nitrile resin film with the thickness of 70 μm. The size-changing ratio by absorbing water of the nitrile resin film with the thickness of 70 μm was 0.25%. The values of bending resistance of substrate film 1 at temperature 50° C. and 90° C. were 0.82 N and 0.12 N, respectively.

3-2. Example 2 of Preparing a Substrate Film 2

The nitrile resin obtained by the above section 2 was molded into a film by inflation method to obtain a nitrile resin with the thickness of 70 μm. Corona discharge treatment was conducted on the surface forming the adhesive layer to obtain a substrate film 2. The temperature distribution value concerning the storage modulus of the obtained nitrite resin film with the thickness of 70 μm shows the same value (a) as in Example 1. The size-changing ratio by absorbing water of the substrate film 2 was 0.25%. The values of bending resistance of the substrate film 1 at 50° C. and 90° C. were 0.30 N and 0.08 N, respectively.

3-3. Example 3 of Preparing a Substrate Film 3

The nitrile resin obtained by the above section 2 was molded into a film by T-die extrusion method to obtain a nitrile resin film with the thickness of 175 μm.

Corona discharge treatment was conducted on the surface forming the adhesive layer to obtain the substrate film 3. The temperature distribution value (b) concerning the storage modulus of the obtained substrate film 3 is illustrated in FIG. 1. The size-changing ratio by absorbing water of the substrate film 3 was 0.18%. The values of bending resistance of substrate film 1 at 50° C. and 90° C. were 0.54 N and 0.14 N, respectively.

3-4. Example 4 of Preparing a Substrate Film 4

A cyclic polyolefin resin (manufactured by Mitsui Chemicals, Inc., trade name: APEL) was molded into a film by T-die extrusion to obtain a cyclic polyolefin resin film with the thickness of 70 μm. Corona discharge treatment was conducted on the surface forming the adhesive layer to obtain the substrate film 4. The temperature distribution value (c) concerning the storage modulus of the obtained substrate film 4 is illustrated in FIG. 1. The size-changing ratio by absorbing water of the substrate film 4 was 0.10%. The values of bending resistance of the substrate film 4 at 50° C. and 90° C. were 0.34 N and 0.10 N, respectively.

3-5. Example 5 of Preparing a Substrate Film 5

Corona discharge treatment was conducted on the surface forming the adhesive layer of non-crystalline polyethylene terephthalate with the thickness of 100 μm (manufactured by Mitsubishi Plastics, Inc., trade name: DIAFIX) to obtain the substrate film 5. The temperature distribution value (d) concerning the storage modulus of the obtained substrate film 5 is illustrated in FIG. 1. The size-changing ratio by absorbing water of the substrate film 5 was 0.10%. The values of bending resistance of the substrate film 5 at 50° C. and 90° C. were 0.51 N and 0.06 N, respectively.

3-6. Comparative Example 1 of Preparing a Substrate Film 6

A biaxially stretched film of polyethylene terephthalate with the thickness of 70 μm was formed, corona discharge treatment being conducted on the surface forming the adhesive layer to obtain the substrate film 6. The temperature distribution value (e) concerning the storage modulus of the substrate film 6 is illustrated in FIG. 1. The size-changing ratio by absorbing water of the substrate film 6 was 0.02%. The values of bending resistance of the substrate film 1 at 50° C. and 90° C. were 0.54 N and 0.44 N, respectively.

3-7. Comparative Example 2 of Preparing a Substrate Film 7

A biaxially stretched film of polyethylene terephthalate with the thickness of 175 µm was formed, corona discharge treatment being conducted on the surface used for forming the adhesive layer to obtain the substrate film 7. The temperature distribution value (f) concerning the storage modulus of the substrate film 7 is illustrated in FIG. 1. The size-changing ratio by absorbing water of the substrate film 7 was 0.02%. The values of bending resistance of the substrate film 7 at 50° C. and 90° C. were 0.80 N and 0.74 N, respectively.

3-8. Comparative Example 3 of Preparing a Substrate Film 8

A biaxially stretched film of polypropylene with the thickness of 70 µm was formed, corona discharge treatment being conducted on the surface forming the adhesive layer to obtain the substrate film 8. The temperature distribution value (g) concerning the storage modulus of the substrate film 8 is illustrated in FIG. 1. The size-changing ratio by absorbing water of the substrate film 8 was 0.02%. The values of bending resistance of the substrate film 1 at 50° C. and 90° C. were 0.40 N and 0.37 N, respectively.

3-9. Comparative Example 4 of Preparing a Substrate Film 9

A film of ethylene-vinyl acetate copolymer [manufactured by DuPont-Mitsui Polychemicals Co., Ltd., trade name: EVAFLEX P-1905 (EV460)] with the thickness of 120 µm was formed by T-die extrusion. Corona discharge treatment was conducted on the surface used for forming the adhesive layer to obtain the substrate film 9. The temperature distribution value (h) concerning the storage modulus of the substrate film 9 is illustrated in FIG. 1. The size-changing ratio by absorbing water of the substrate film 9 was –0.02%.

The value of bending resistance of the substrate film 9 at 50° C. was 0.54 N. The value at 90° C. could not be measured.

4. Example 1 of Preparing Adhesive Agent Coating Solution

Emulsion polymerization was conducted for nine hours by adding deionized water 150 parts by weight, 4,4'-azobis (4-cyano valeric acid) [manufactured by Otsuka Chemical Co., Ltd, trade name: ACVA] 0.5 parts by weight as polymerization initiators, butyl acrylate 52.25 parts by weight, ethyl methacrylate 25 parts by weight, 2-hydroxyethyl methacrylate 15 parts by weight, methacrylic acid 6 parts by weight, acryl amide 1 part by weight, and ammonium salt of polyoxyethylene nonylphenyl ether sulfate (the average number of added moles of ethyleneoxide:about 20) in which the benzene ring is introduced by polymeric 1-propenyl group [manufactured by Dai-ichi Kogyo Seiyaku Co, Ltd., trade name: AQUALON HS-20] 0.75 parts by weight as a water soluble comonomer into a polymerization reactor, keeping stirring at temperature 70° C. to obtain an acrylic resin water emulsion. Then it was neutralized with ammonia water of 14 weight percent, to obtain an adhesive polymer emulsion which includes 40 weight percent as solid contents. The obtained adhesive-based emulsion 100 parts by weight (concentration of the adhesive polymer: 40 weight percent) was weighted and adjusted at pH9.3 by further adding ammonia water 14 weight percent. Then aziridine cross-linker [manufactured by Nippon Shokubai Co., Ltd., trade name: Chemitite PZ-33] 2.5 parts by weight and diethylene glycol monobutyl ether 5 parts by weight were added to obtain an adhesive agent coating solution used for forming the adhesive layer.

5. Example 1~5, Comparative Example 1~4 for Preparing the Adhesive Film

The substrate films 1 to 5 obtained in Examples 1 to 5 were used for Examples 1 to 5 for preparing the adhesive film, and substrate films 6 to 9 obtained in Comparative Examples 1 to 4 of a substrate film were used for Comparative Examples 1 to 4 for preparing the adhesive film. The adhesive agent coating solution obtained in the above section 4 was coated on the mold-releasing-processed (siliconized) surface of a polyethylene terephthalate film (peeling film) with the thickness of 38 µm by a comma coater, then dehydrated at 120° C. for four minutes to form the adhesive layer with the thickness of 10 µm. The obtained adhesive layer was then adhered to the substrate films 1 to 9 obtained in the above sections 3-1 to 3-9 with the surface where corona discharge treatment was processed by a dry laminator and pressed, to make the adhesive layer transferred to the surface where corona discharge treatment was conducted on the substrate films 1 to 9. After that, it was heated for forty-eight hours at 60° C. and then cooled down to the room temperature, to obtain an adhesive film 1~9 for protecting the surface of a semiconductor wafer. The adhesive films 1 to 9 prepared by using the substrate films 1 to 9 are denominated as adhesive films for protecting the surface of a semiconductor wafer. The adhesive strengths of the obtained adhesive films 1 to 9 for protecting the surface of a semiconductor wafer were 80 g/25 mm, 75 g/25 mm, 90 g/25 mm, 75 g/25 mm, 90 g/25 mm, 75 g/25 mm, 90 g/25 mm, 80 g/25 mm, and 85 g/25 mm, respectively in order.

6. Examples of Back Surface Processing for a Semiconductor Wafer 6-1. Example 1 of Back Surface Processing for a Semiconductor Wafer The surface of a semiconductor silicon wafer coated with a polyimide with the thickness of 10 µm [diameter: 200 mm (8 inches), thickness: 725 µm] was adhered with the adhesive film 1 for protecting the surface of a semiconductor wafer through the adhesive layer and was conducted under the back grinding process until the thickness of the semiconductor wafer was reduced to 50 µm by using a grinding machine [manufactured by Disco Corp., type; DFG-860] while cooling down under water. Ten of semiconductor silicon wafers were processed in the same way with such back grinding procedure. There was no trouble during the back grinding process such as dropping or breaking of semiconductor wafers. After completion of the above back surface processing, the warpage of the semiconductor silicon wafer was measured by the above-described method while the adhesive film 1 for protecting the surface of a semiconductor wafer remained adhered as it was. As a result, the average warpage value of wafers was 1.5 mm. Then the adhesive film 1 for protecting the surface of a semiconductor wafer was peeled off by using a peeling machine for surface protection tapes [manufactured by Nitto Seiki Co., Ltd., HR-8500II; the peeling tape used was manufactured by Mitsui Chemicals, Inc. ICROS RM], in heating at 80° C. through a Chuck table. No wafer damage was found in peeling. Then the warpage of wafers after peeling off the adhesive film 1 for protecting the surface of a semiconductor wafer by the above-described method. As a result, the average warpage value of wafers was 25 mm. The result is illustrated in Table 1.

6-2. Examples 2 to 5, and Comparative Examples 1 to 4 of Back Surface Processing for a Semiconductor Wafer The same method with Example 1 was conducted except using the adhesive films 2 to 5 in Examples 2 to 5 for protecting the surface of a semiconductor wafer of back surface processing for a semiconductor wafer and the adhesive films 6 to 9 in Comparative Examples 1 to 4 for protecting the surface of a semiconductor wafer.

As a result, there was no trouble such as dropping and breaking semiconductor wafers and so on during the back grinding process of wafers in Examples 2 to 5. Also no problem was found in the peeling properties of the adhesive film for protecting the surface of a semiconductor wafer. The average warpage values of wafers after the grinding process were 1.8 mm, 0.5 mm, 1.7 mm, and 1.0 mm in order and there was found no problem.

Though no troubles occurred in Comparative Examples 1 to 3 such as dropping or breaking of a semiconductor wafer during the back grinding process, in Comparative Example 4, five wafers were damaged during the back grinding process. As for the peeling properties of the adhesive film for protecting the surface of a semiconductor wafer, there occurred a crack at the end of seven wafers in Comparative Example 1. In Comparative Example 2, the rigidity of the substrate film for the adhesive film was so high that the adhesive film for protecting the surface of a semiconductor wafer could not be peeled off. In Comparative Example 3, there occurred a crack at the end of three wafers. In Comparative Example 4, in peeling the adhesive film concerning wafers which were not damaged, no problem was found in the peeling properties. The average warpage values of wafers after the grinding process were 1.9 mm, 0.5 mm, 5 mm, and 26 mm in order.

The results are illustrated in Table 1, 2.

<Explanation for Descriptions of Table 1, 2>

EVA: ethylene vinyl acetate copolymer,
Non-crystalline PET: non-crystalline polyethylene terephthalate,
PET: biaxial stretching polyethylene terephthalate,
OPP: biaxial stretching polypropylene,
proportion of Maximum against Minimum: proportion of the maximum value of storage modulus(E'max) against the minimum value(E'min) within the temperature range from 18 to 50° C. (E'max/E'min).

TABLE 1

| | Substrate | Requisite | Composition of substrate film | Bending resistance (N) 50° C./90° C. | (E'max/E'min) | Size changing ratio by absorbing water (%) | Adhesive Strength (g/25 mm) | Crack of wafers in the back surface grinding (piece) | warpage degree before peeling the adhesive film (mm) | Situation in peeling the adhesive film |
|---|---|---|---|---|---|---|---|---|---|---|
| Example 1 | 1 | A + B<br>A + C<br>A + B + C | Nitrile resin 70 μm + EVA 50 μm | 0.82/0.12 | 1.07 | 0.25 | 80 | 0 | 1.5 mm | No problems in peeling wafer damage: 0 pieces |
| Example 2 | 2 | A + B<br>A + C<br>A + B + C | Nitrile resin 70 μm | 0.30/0.08 | 1.07 | 0.25 | 75 | 0 | 1.8 mm | No problems in peeling wafer damage: 0 pieces |
| Example 3 | 3 | A + B<br>A + C<br>A + B + C | Nitrile resin 175 μm | 0.54/0.14 | 1.07 | 0.18 | 90 | 0 | 0.5 mm | No problems in peeling wafer damage: 0 pieces |
| Example 4 | 4 | A + B<br>A + C<br>A + B + C | Cyclic-polyolefin 70 μm | 0.34/0.10 | 1.07 | 0.10 | 75 | 0 | 1.7 mm | No problems in peeling wafer damage: 0 pieces |
| Example 5 | 5 | A + B<br>A + C<br>A + B + C | Non-crystalline PET 100 μm | 0.51/0.06 | 1.10 | 0.10 | 90 | 0 | 1.0 mm | No problems in peeling wafer damage: 0 pieces |

TABLE 2

| | Substrate | Requisite | Composition of substrate film | Bending resistance (N) 50° C./90° C. | (E'max/E'min) | Size changing ratio by absorbing water (%) | Adhesive Strength (g/25 mm) | Crack of wafers in the back surface grinding (piece) | warpage degree before peeling the adhesive film (mm) | Situation in peeling the adhesive film |
|---|---|---|---|---|---|---|---|---|---|---|
| Comparative example 1 | 6 | A | PET 70 μm | 0.54/0.44 | 1.02 | 0.02 | 75 | 0 | 1.9 mm | Seven wafers had cracks on the edge |
| Comparative example 2 | 7 | A | PET 175 μm | 0.80/0.74 | 1.02 | 0.02 | 90 | 0 | 0.5 mm | Impossible to peel |

TABLE 2-continued

|  | Substrate | Requisite | Composition of substrate film | Bending resistance (N) 50° C./ 90° C. | (E'max/ E'min) | Size changing ratio by absorbing water (%) | Adhesive Strength (g/ 25 mm) | Crack of wafers in the back surface grinding (piece) | warpage degree before peeling the adhesive film (mm) | Situation in peeling the adhesive film |
|---|---|---|---|---|---|---|---|---|---|---|
| Comparative example 3 | 8 | A | OPP 70 μm | 0.40/ 0.37 | 1.58 | 0.02 | 80 | 0 | 5 mm | Three wafers had cracks on the edge. |
| Comparative example 4 | 9 | — | EVA 120 μm | 0.54/— | 3.56 | −0.02 | 85 | 5 | 26 mm | No problem in peeling |

What is claimed is:

1. An adhesive film for protecting a surface of a semiconductor wafer comprising a substrate film having on one surface thereof an adhesive layer formed, characterized in that said substrate film satisfies the following requisites (A) and at least one of (B) or (C):

requisite (A): high rigidity properties in which the value of film bending resistance at 50° C. is within the range from 0.08 to 1.50N;

requisite (B): properties in which the value of film bending resistance at 900° C. is one-third or less than the value of film bending resistance at 50° C.;

requisite (C): high elastic modulus properties with expansibility by water absorption in which size-changing ratio by absorbing water for four hours at 23° C. and 90% RH is 0.05 to 0.5%.

2. The adhesive film for protecting the surface of a semiconductor wafer as claimed in claim 1, in which said substrate film comprises at least one resin layer with low elastic modulus.

3. The adhesive film for protecting the surface of a semiconductor wafer as claimed in claim 1, in which the total thickness of said substrate film is 50 to 300 μm.

4. A method of processing a non-circuit-formed surface (back surface) of a semiconductor wafer, comprising the steps of adhering an adhesive film for protecting a surface of a semiconductor wafer to a circuit-formed surface of the semiconductor wafer through its adhesive layer, reducing the thickness of the non-circuit-formed surface (back surface) of the semiconductor wafer until its thickness is reduced to 150 μm or less, and then; peeling said adhesive film for protecting the surface of a semiconductor wafer by heating to a temperature within the range of from 50 to 90° C., wherein said adhesive film for protecting the surface of the semiconductor wafer satisfies the following requisites (A) and at least one of (B) or (C):

requisite (A): high rigidity properties in which the value of film bending resistance at 50° C. is within the range from 0.08 to 1.50N:

requisite (B): properties in which the value of film bending resistance at 90° C. is one-third or less than value of film bending resistance at 50° C.;

requisite (C): high elastic modulus properties with expansibility by water absorption in which size-changing ratio by absorbing water for four hours at 23° C. and 90% RH is 0.05 to 0.5%.

5. An adhesive film for protecting a surface of a semiconductor wafer comprising a substrate film having on one surface thereof an adhesive layer formed, characterized in that said substrate film comprises at least one layer satisfying the following requisites (A') and at least one of (B') or (C):

requisite (A'): high elastic modulus properties in which storage modulus within the total temperature range of from 18 to 5° C. is $1 \times 10^9$ Pa to $1 \times 10^{10}$ Pa;

requisite (B'): high elastic modulus properties in which storage modulus within at least part of the temperature range of from 50 to 90° C. is not more than $1 \times 10^8$ Pa;

requisite (C): high elastic modulus properties with expansibility by water absorption in which size-changing ratio by absorbing water for four hours at 23° C. and 90% RH is 0.05 to 0.5%.

6. The adhesive film for protecting the surface of a semiconductor wafer as claimed in claim 5, in which a proportion of a maximum storage modulus(E'max) against a minimum storage modulus(E'min) (E'max/E'min) concerning said layer satisfying said requisites (A') and at least one of (B') or (C) is 1.0 to 1.1 within the temperature range of from 18 to 50° C.

7. The adhesive film for protecting the surface of a semiconductor wafer as claimed in claim 5, in which the thickness of said layer satisfying said requisites (A') and at east one of (B') or (C) is 30 to 300 μm.

8. The adhesive film for protecting the surface of a semiconductor wafer as claimed in claim 5, in which said substrate film comprises at least one resin layer with low elastic modulus.

9. The adhesive film for protecting the surface of a semiconductor wafer as claimed in claim 8, in which said resin layer with low elastic modulus comprises an ethylene-vinyl acetate copolymer layer.

10. The adhesive film for protecting the surface of a semiconductor water as claimed in claim 8, in which the thickness of said resin layer with low elastic modulus is 30 to 250 μm.

11. The adhesive film for protecting the surface of a semiconductor wafer as claimed in claim 5, in which the total thickness of said substrate film is 50 to 300 μm.

12. A method of processing a non-circuit-formed surface (back surface) of a semiconductor wafer, comprising the steps of adhering an adhesive film for protecting a surface of a semiconductor wafer to a circuit-formed surface of the semiconductor wafer through its adhesive layer, reducing the thickness of the non-circuit-formed surface (back surface) of the semiconductor wafer until its thickness is reduced to 150 μm or less, and then; peeling said adhesive film for protecting the surface of a semiconductor wafer by heating to a temperature with in the range of from 50 to 90° C., wherein said adhesive film for protecting the surface of the semiconductor wafer satisfies the following requisites (A) and at least one of (B) or (C):

requisite (A): high rigidity properties in which the value of film bending resistance at 50° C. is within the range from 0.08 to 1.50N;

requisite (B): properties in which the value of film bending resistance at 90° C. is one third or less than the value of film bending resistance at 50° C.;

requisite (C): high elastic modulus properties with expansibility by water absorption in which size-changing ratio by absorbing water for four hours at 23° C. and 90% RH is 0.05 to 0.5%.

* * * * *